US011476678B2

(12) United States Patent
Werner et al.

(10) Patent No.: US 11,476,678 B2
(45) Date of Patent: *Oct. 18, 2022

(54) PREDICTIVE RECHARGEABLE BATTERY MANAGEMENT SYSTEM

(71) Applicant: INTERNATIONAL BUSINESS MACHINES CORPORATION, Armonk, NY (US)

(72) Inventors: John S. Werner, Fishkill, NY (US); Noah Singer, White Plains, NY (US); Arkadiy O. Tsfasman, Wappingers Falls, NY (US); John G. Torok, Poughkeepsie, NY (US); Budy D. Notohardjono, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 115 days.

This patent is subject to a terminal disclaimer.

(21) Appl. No.: 17/147,689

(22) Filed: Jan. 13, 2021

(65) Prior Publication Data

US 2021/0135467 A1    May 6, 2021

Related U.S. Application Data

(63) Continuation of application No. 16/135,201, filed on Sep. 19, 2018, now Pat. No. 10,978,883.

(51) Int. Cl.
*H02J 7/00* (2006.01)
*G01R 31/36* (2020.01)
(Continued)

(52) U.S. Cl.
CPC ...... *H02J 7/00041* (2020.01); *G01R 31/3648* (2013.01); *H02J 7/0013* (2013.01);
(Continued)

(58) Field of Classification Search
CPC ................................................... H02J 7/00041
(Continued)

(56) References Cited

U.S. PATENT DOCUMENTS

| 5,250,904 A | * | 10/1993 | Salander | ............... | H02J 7/0047 |
| | | | | | 340/636.11 |
| 7,619,417 B2 | * | 11/2009 | Klang | ............... | G01R 31/3647 |
| | | | | | 324/426 |

(Continued)

FOREIGN PATENT DOCUMENTS

| EP | 2 571 076 B1 | 4/2017 |
| GB | 2 476 696 A | 7/2011 |
| WO | WO 2017/091231 A1 | 6/2017 |

OTHER PUBLICATIONS

Mel, et al., "The NIST Definition of Cloud Computing," National Institute of Standards and Technology, Information Technology Laboratory, Special Publication 800-145, Sep. 2011, (pp. 1-7).

(Continued)

*Primary Examiner* — Jerry D Robbins
(74) *Attorney, Agent, or Firm* — Teddi Maranzano, Esq.; Kevin P. Radigan, Esq.; Heslin Rothenberg Farley & Mesiti, P.C.

(57) ABSTRACT

Predictive rechargeable battery management is provided, which includes obtaining performance data on a battery cell of multiple rechargeable battery cells within a product, and comparing the performance data of the battery cell to statistical data on battery cell performance of a plurality of battery cells. Further, the managing includes determining, based on the comparing, that performance of the battery cell is trending away from the statistical data of battery cell performance of the plurality of battery cells. Further, the managing includes performing a battery-related action based (Continued)

on the performance of the battery cell trending away from that of the plurality of battery cells.

18 Claims, 16 Drawing Sheets

(51) Int. Cl.
*H01M 10/42* (2006.01)
*H01M 10/0525* (2010.01)
*G01R 31/392* (2019.01)
*G01R 31/396* (2019.01)

(52) U.S. Cl.
CPC .......... *H02J 7/0022* (2013.01); *G01R 31/392* (2019.01); *G01R 31/396* (2019.01); *H01M 10/0525* (2013.01); *H01M 2010/4271* (2013.01)

(58) Field of Classification Search
USPC ........................................................ 320/132
See application file for complete search history.

(56) References Cited

U.S. PATENT DOCUMENTS

| | | | |
|---|---|---|---|
| 7,928,735 B2* | 4/2011 | Huang | B60L 58/15 |
| | | | 324/426 |
| 8,258,748 B2* | 9/2012 | Constien | G01R 31/392 |
| | | | 320/132 |
| 9,267,994 B2* | 2/2016 | Plestid | G01R 31/392 |
| 9,369,656 B2* | 6/2016 | Innes | H04N 21/42204 |
| 10,717,362 B2* | 7/2020 | Liang | G06Q 30/0645 |
| 2006/0284617 A1* | 12/2006 | Kozlowski | H01M 6/5044 |
| | | | 324/426 |
| 2012/0262107 A1* | 10/2012 | Zhao | H02J 7/007182 |
| | | | 320/107 |
| 2017/0131363 A1* | 5/2017 | Scott | G01R 31/392 |
| 2019/0372179 A1 | 12/2019 | Singer et al. | |
| 2020/0088796 A1 | 3/2020 | Werner et al. | |
| 2020/0376979 A1* | 12/2020 | Liang | B60L 3/12 |

OTHER PUBLICATIONS

Werner et al., "List of IBM Patents and/or Patent Applications Treated as Related", U.S. Appl. No. 17/147,689, filed Jan. 13, 2021, dated Jan. 13, 2021 (2 pages).

* cited by examiner

PREDICTIVE RECHARGEABLE BATTERY MANAGEMENT SYSTEM

BACKGROUND

Lithium-ion batteries are one type of rechargeable battery of a variety of rechargeable batteries available for use as energy sources, including as backup energy sources. Lithium-ion batteries are rechargeable batteries in which lithium-ions move from a negative electrode to a positive electrode during discharge and back when charging. An intercalated lithium compound is used in a lithium-ion battery as one electrode material. The electrolyte, which allows for ionic movement, and the two electrodes are the constituent components of a lithium-ion battery cell. A cell is a basic electrochemical unit that contains the electrodes, separator and electrolyte. A battery or battery pack is a collection of cells or cell assemblies. These may be ready for use by providing an appropriate housing, and electrical interconnections.

Many products use rechargeable batteries, but not all rechargeable batteries, even of the same type perform equally over time. For instance, a first lithium-ion cell may perform well for 1,000 charge cycles, while a second lithium-ion cell of identical type may drop in performance after less than 500 charge cycles. Such differences can result in poor battery performance and can lead to degraded product performance.

SUMMARY

Certain shortcomings of the prior art are overcome and additional advantages are provided through the provision of a method of managing rechargeable battery cells. The method includes obtaining performance data on a battery cell of multiple rechargeable battery cells within a product, and comparing, by a processor, the performance data of the battery cell to statistical data on battery cell performance of a plurality of battery cells. Further, the method includes determining, based on the comparing, that performance of the battery cell is trending away from the statistical data of battery cell performance of the plurality of battery cells, and performing a battery-related action based on the performance of the battery cell trending away from that of the plurality of battery cells. b In another aspect, a system for managing rechargeable battery cells is provided. The system includes a memory, and a processor communicatively coupled to the memory. The system performs a method, which includes obtaining performance data on a battery cell of multiple rechargeable battery cells within a product, and comparing the performance data of the battery cell to statistical data on battery cell performance of a plurality cells. Further, the method includes determining, based on the comparing, that performance of the battery cell is trending away from the statistical data of battery cell performance of the plurality of battery cells, and performing a battery-related action based on the performance of the battery cell trending away from that of the plurality of battery cells.

In a further aspect, a computer program product is provided for managing rechargeable battery cells. The computer program product includes a computer-readable storage medium having program instructions embodied therewith. The program instructions are executable by a processor to cause the processor to: obtain performance data on a battery cell of multiple rechargeable battery cells within a product; compare the performance data of the battery cell to statistical data on battery cell performance of a plurality of battery cells; determine, based on the comparing, that performance of the battery cell is trending away from the statistical data of battery cell performance of the plurality of battery cells; and perform a battery-related action based on the performance of the battery cell trending away from that of the plurality of battery cells.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
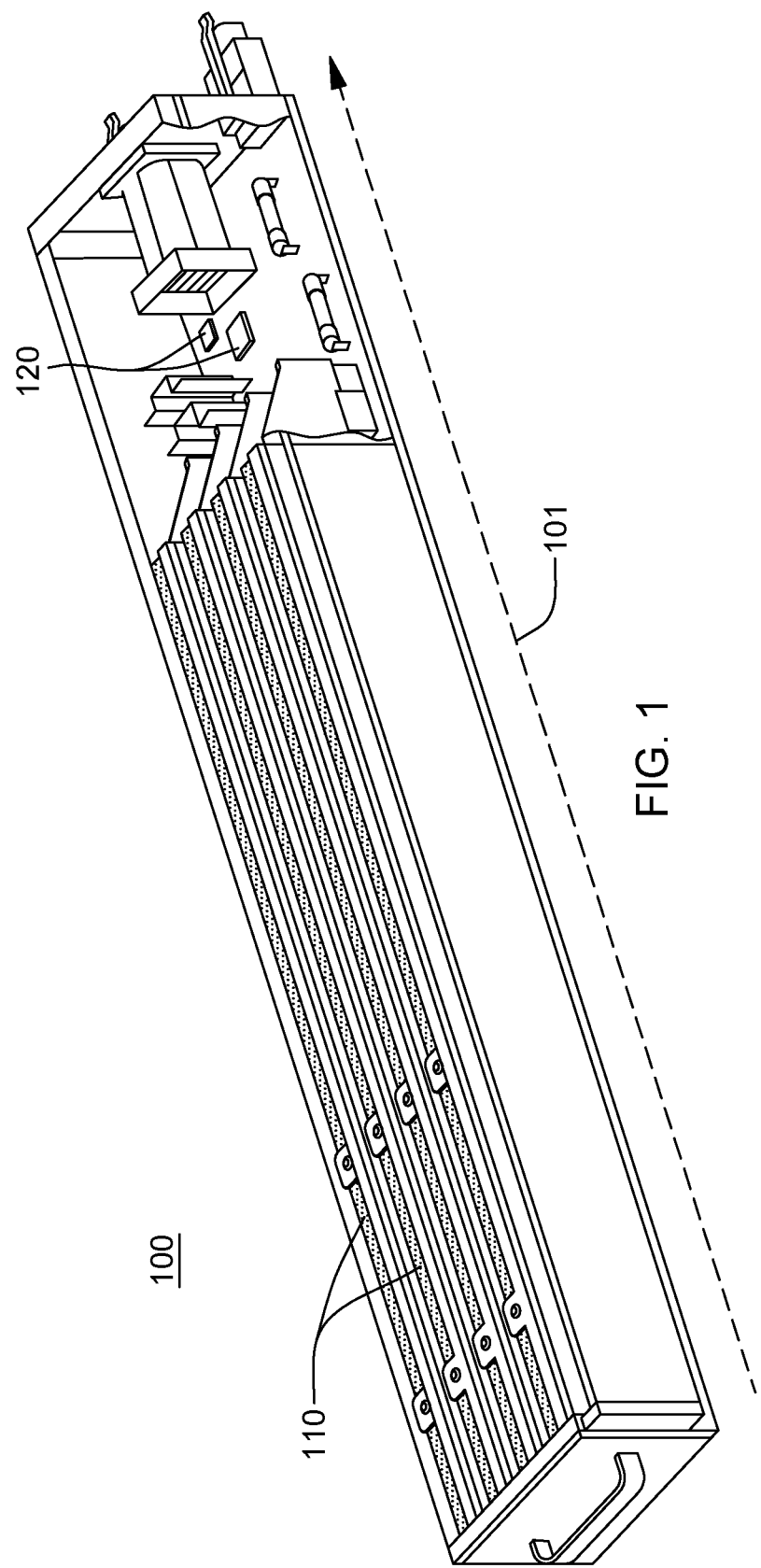
FIG. 1 depicts one embodiment of a rechargeable battery pack, or battery, to benefit from predictive battery cell management, in accordance with one or more aspects of the present invention.

Aspects of the present invention and certain features, advantages and details thereof, are explained more fully below with reference to the non-limiting example(s) illustrated in the accompanying drawings. Descriptions of well-known systems, devices, processing techniques, etc., are omitted so as to not unnecessarily obscure the invention in detail. It should be understood, however, that the detailed description in this specific example(s), while indicating aspects of the invention, is given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application to facilitate, for instance, automated predictive managing of rechargeable battery cells.

The illustrative embodiments may be described below using specific code, designs, architectures, protocols, layouts, schematics, or tools only as examples, and are not limited to the illustrative embodiments. Furthermore, the illustrative embodiments may be described in certain instances using particular software, tools, and data processing environments only as example for clarity of description. The illustrative embodiments may be used in conjunction with other comparable or similarly purposed structures, systems, applications, or architectures. An illustrative management control embodiment may be implemented in hardware, software, or a combination thereof.

The examples in this disclosure are used only for clarity of description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed herein.

By way of example only, a data center installation, such as an air-cooled computer room or data center, may include computing (or information technology (IT)) racks disposed within rows in the data center installation. In an air-cooled data center installation, cooling is typically in a front-to-back cooling approach. Namely, according to this approach, cooled air is drawn in through a front (air inlet side) of each rack, and hot air is exhausted from a back (air outlet side) of each rack. The cooled air drawn into the front of the rack may be supplied to air inlets of the computing components (e.g., servers) disposed within the racks. The cooled air, which may be provided through one or more perforated tiles into cold air aisles of the data center, may be drawn into the computing racks, heated and subsequently exhausted into the data center via one or more air outlets of the individual racks into hot air aisles of the data center.

In one or more implementations, computing racks, such as those noted above, include a variety of components within the racks, including, for instance, one or more battery backup packs. There are a wide variety of batteries available for use as energy sources, including as backup energy sources. Lithium-ion batteries have certain inherent advantages over other rechargeable battery technologies, including, for instance, a higher power density, a lower weight, lower self-discharge, and little or no "memory" effect. Lithium-ion batteries can be used in many applications, including mobile devices (such as tablets, laptops, portable computers, etc.), watches, cameras, pace makers, as well as computing systems, etc.

By way of example only, FIG. 1 depicts one embodiment of a battery pack system 100 including multiple battery cells 110 and associated components 120 configured as, for instance, a battery pack backup to provide standby power to one or more computing components of a computing or information technology (IT) rack for at least a specified period of time upon loss of main power. Depending on the implementation, a computing rack may include a number of battery pack backup systems, such as battery pack system 100 of FIG. 1, with each pack including a potentially large number of battery cells. As noted, when employed in a computing rack, a cooling airflow 101 is typically provided through the rack to facilitate cooling of the computing components disposed within the rack, including, for instance, the battery pack backup system(s). In one or more embodiments, the battery cells employed in the battery pack are assumed to be rechargeable battery cells, such as rechargeable lithium-ion battery cells, by way of example. Components 120 may include, in part, any conventional components associated with the battery pack system to facilitate, for instance, charging or discharging of the battery cells when appropriate to provide, for instance, backup power to one or more components within the computing rack, as well as, in part, to control and monitor components of a battery management system implementing one or more of the aspects disclosed herein.

Note again that the battery pack system embodiment of FIG. 1 is presented by way of example only. Rechargeable battery packs are used in a wide variety of products, including in backup or standby applications, standby and/or standalone applications, as well as standalone applications. In a backup or standby application, the battery pack is generally connected to a power source via a charger, and there is typically no time constraint on managing battery pack cell capacity, and processing is fully sustainable. Examples include various backup power systems, such as that depicted in FIG. 1 for a data center computing rack. In a standby and/or standalone application, the battery pack may be connected at different times to a power source across a charger, such as may be the case with an electric vehicle or electric forklift, by way of example. At other times, the battery pack is unconnected to the power source, such as when the electric vehicle or forklift is in use. In a standalone application, the battery pack may not be connected to a charger most of the time, such as in the case of a mobile phone or a laptop computing device.

Figure 2A:
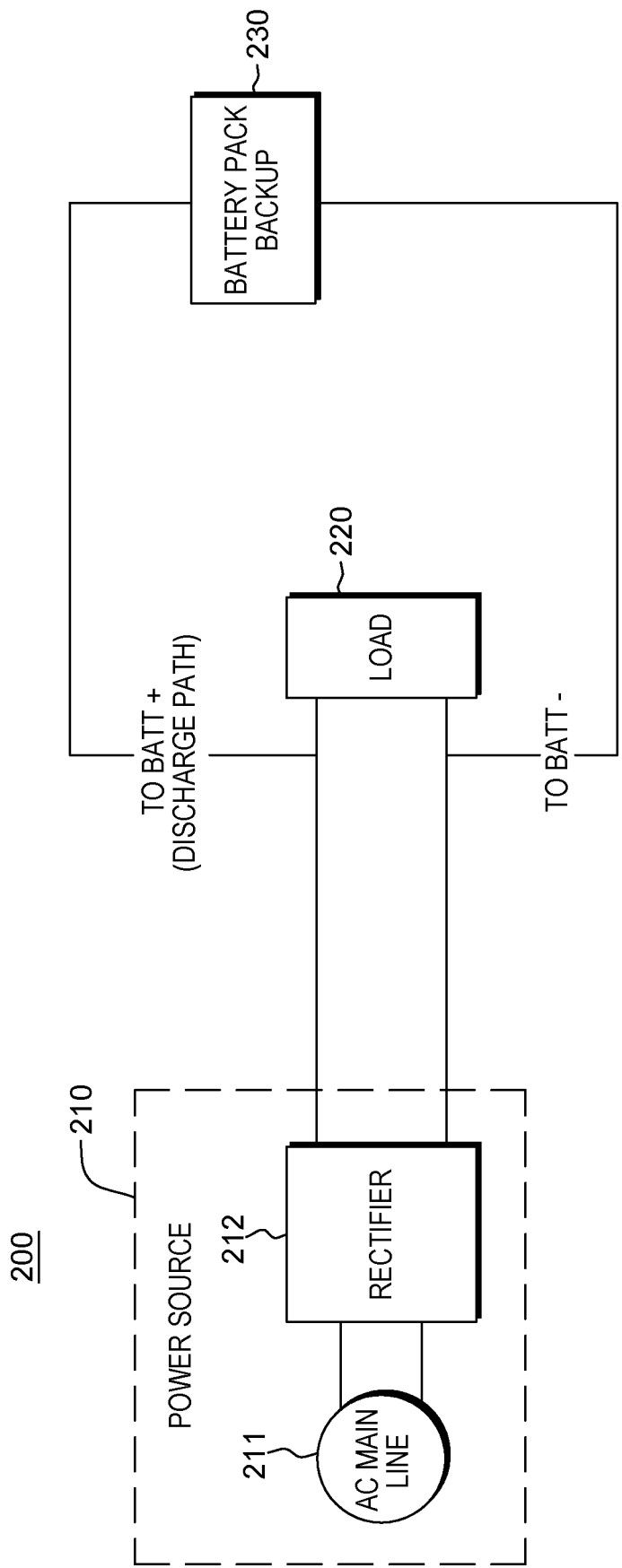
FIG. 2A depicts one embodiment of a system with a battery pack, connected as a battery backup, and which can incorporate predictive battery cell management, in accordance with one or more aspects of the present invention.

FIG. 2A is a schematic of one embodiment of a system 200 which includes a power source 210, a load 220, and a battery pack backup 230. By way of example, system 200 can be a computing rack, or a component within a computing rack, with battery pack backup 230 providing power to load 220 should power from power source 210 be interrupted. In the embodiment depicted, and by way of example only, power source 210 includes power from an AC main line 211 which is then rectified 212 to provide a desired DC power to load 220.

Figure 2B:
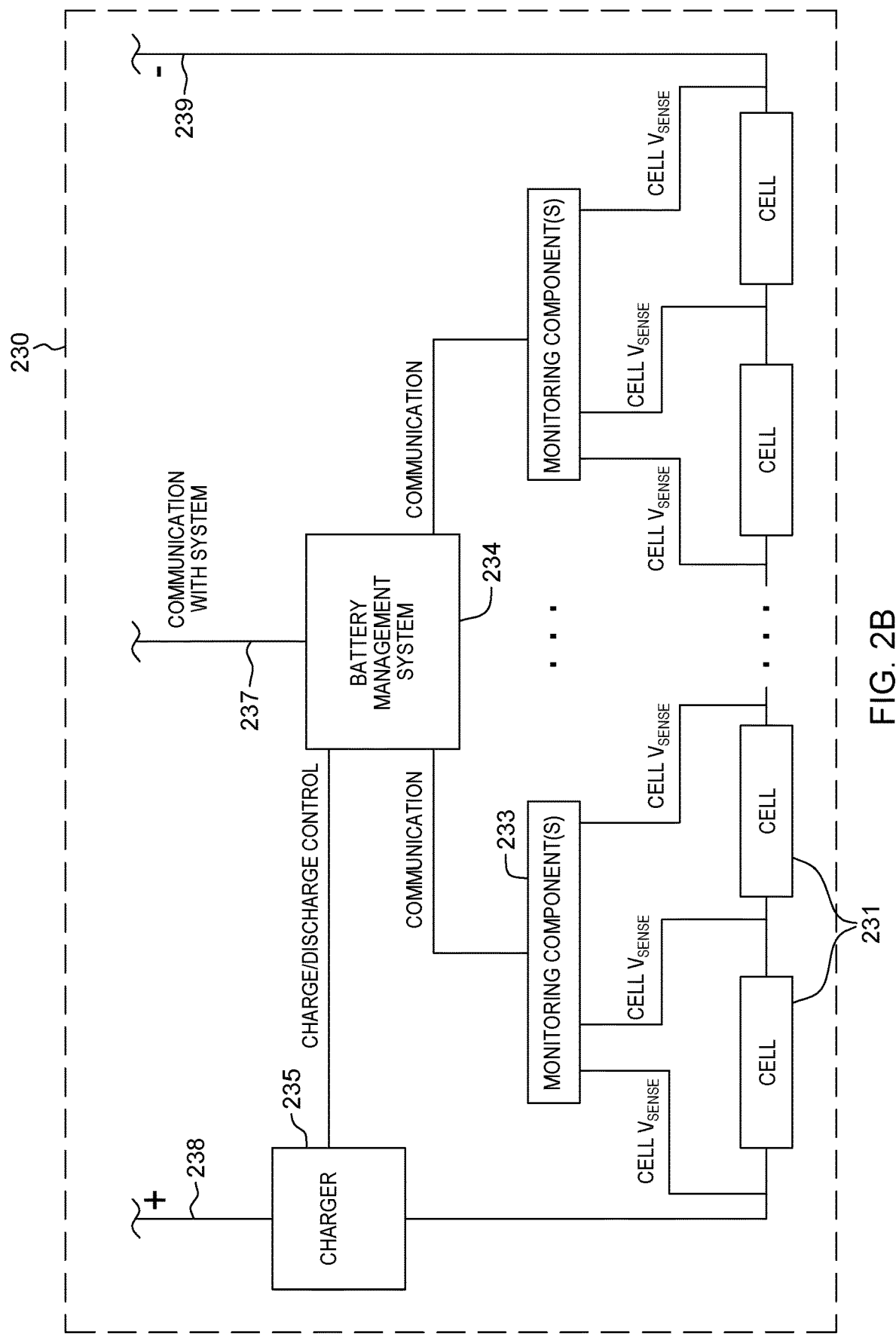
FIG. 2B depicts one embodiment of a rechargeable battery, with predictive battery cell management, in accordance with one or more aspects of the present invention.

FIG. 2B depicts one embodiment of battery pack backup 230 which can be used, for instance, in a system such as depicted in FIG. 2A. Note that a battery pack being discussed as a battery backup is provided by way of example only. The predictive battery cell management system described herein is applicable to any of a wide variety of battery packs, or batteries, for a wide variety of uses, such as for standby applications, intermittent standby and standalone applications, as well as mostly standalone applications.

In the embodiment of FIG. 2B, battery pack backup 230 is shown to include a plurality of battery cells 231, which can be grouped into one or more cell stacks. In one or more embodiments, cell voltage can be monitored or sensed. The sensed cell voltages allow the monitoring components and thereby the controller to know what state of charge a cell is in, for instance, for shutting off or adjusting charging of a cell. Monitoring components 233 are provided to monitor the voltage across the individual cells in the battery pack. Where the battery cells are lithium-ion battery cells, the monitoring components 233 can be multi-cell lithium-ion battery managers, such as the multi-cell lithium-ion battery managers available from various industry suppliers. The monitoring components 233 are operatively coupled to a controller or battery management system 234, which can implement logic in accordance with one or more aspects disclosed herein. As shown, battery management system 234 is coupled to a charger 235 for charge control, in accordance with one or more aspects of the present invention. Additionally, battery management system 234 is in communication 237 with one or more central cognitive servers or systems, as discussed herein. Power input 238 and power output 239 lines are also provided coupling battery pack backup 230 to an actual load, such as load 220 of system 200 of FIG. 2A.

As noted initially, many products use rechargeable batteries today, but not all rechargeable batteries, even of the same type/specification, perform equally over time. For instance, a rechargeable battery can pass initial manufacturer testing, and be within specification initially within an end user's product without showing any sign of possible future performance degradation. When occurring, poor battery performance can lead to degraded product performance, and potentially significant end user negative impact. For instance, in the case of a computing rack with one or more rechargeable battery backup packs, poor performance of one or more batteries could potentially cause one or more computing systems to go down early in the event that the battery packs are needed.

Disclosed herein, in one or more aspects, are predictive rechargeable battery management methods, systems and computer program products which allow a poor performing rechargeable battery in the field to be identified early, such that an action can be taken to, for instance, replace the battery before causing a negative impact on the end user's product, or dynamically adjust operation of the battery to improve performance and/or extend life of the battery.

Generally stated, disclosed herein is a predictive rechargeable battery cell management method which obtains performance data on a battery cell of multiple rechargeable battery cells within one or more products, and compares the performance data of the battery cell to statistical data on battery cell performance of a plurality of battery cells of similar type to the battery cell and in corresponding condition(s) to the battery cell. The management facility further determines, based on the comparing, that performance of the battery cell is trending away from the statistical data of battery cell performance of the plurality of battery cells, and automatically performs a battery-related action based on the performance of the battery cell trending away from that of the plurality of battery cells of similar type and in corresponding condition(s) to the battery cell.

By way of example, the battery-related action could be, or could include, a notification or alert regarding the battery cell's current performance. In one or more embodiments, a prediction on future performance of the battery cell can also be provided, as explained further below. Additionally, or alternatively, the battery-related action could include adjusting a state of charge for a charge cycle of the battery cell to extend life of the battery cell. For instance, rather than operating the battery cell at a state of charge level of 80% (i.e., the charged state for the charge cycle), the charge state could be adjusted to 75%, while other battery cells in the product remain at a state of charge level of 80%. Any desired increase or decrease in the charged state level for a particular battery cell trending away from the performance of the plurality of battery cells could be performed, depending on, for instance, the direction and extent of the trending away.

Figure 3A:
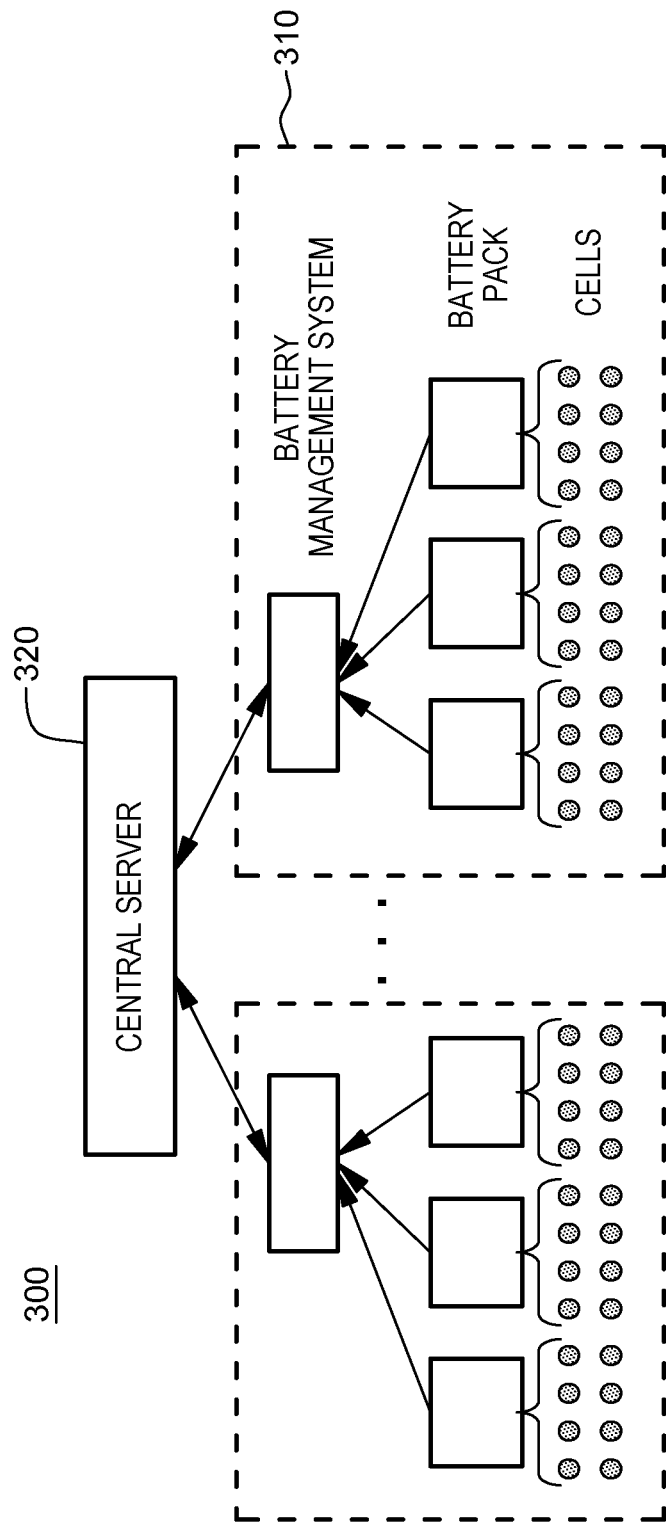
FIG. 3A depicts one embodiment of a predictive battery cell management system, in accordance with one or more aspects of the present invention.

FIG. 3A is a high-level depiction of one embodiment of an environment 300 incorporating a predictive rechargeable battery management system, in accordance with one or more aspects of the present invention. In the depicted environment 300, a plurality of similar end user products 310 are assumed, along with one or more central cognitive servers 320. Products 310 can be any of a variety of products available today which use or incorporate rechargeable batteries, either a primary energy source, or as a backup energy source. For instance, products 310 could be computing racks at one or more data center installations in one or more geographic locations. As noted above, the product could also be other types of systems or devices, such as a mobile device, watch, camera, pace maker, etc., and can generally be any product which currently, or in the future, can benefit from the use of rechargeable batteries. In the embodiment depicted, the one or more central cognitive servers 320 communicate with system level controllers, such as a battery management system 234 noted above in connection with FIG. 2B, associated with each product.

The battery management system (or integrated battery feature) within product 310 provides pack-level control and monitoring, which might include use of monitoring component(s), such as monitoring component(s) 233 noted above in connection with FIG. 2B. Each product is shown to include a plurality of rechargeable battery cells, which in one or more embodiments, can be individual lithium-ion cells. In implementation, products 310 can be owned by a same end user or could be the same product owned by different end users. A variety of battery-related actions can be performed as described herein based on the rechargeable battery management system determining that performance of a particular battery cell is trending away from the statistical data on performance of a plurality of the same battery cells in corresponding condition(s). For instance, cell performance data from multiple products 310 can be received at a backend cognitive server 320 that has access to the battery information for a plurality of same battery cells currently in operation under corresponding condition(s). In one or more implementations, the battery-related action taken by the system could be, for instance, generating a notification to an end user to replace one or more integrated battery features, battery packs, and/or individual rechargeable battery cells within the product. Further, central cognitive server 320 could direct one or more individual battery management systems to take action to improve battery cell life by, for instance, increasing or decreasing the state of charge for the charge cycle of one or more individual rechargeable battery cells within a product.

Figure 3B:
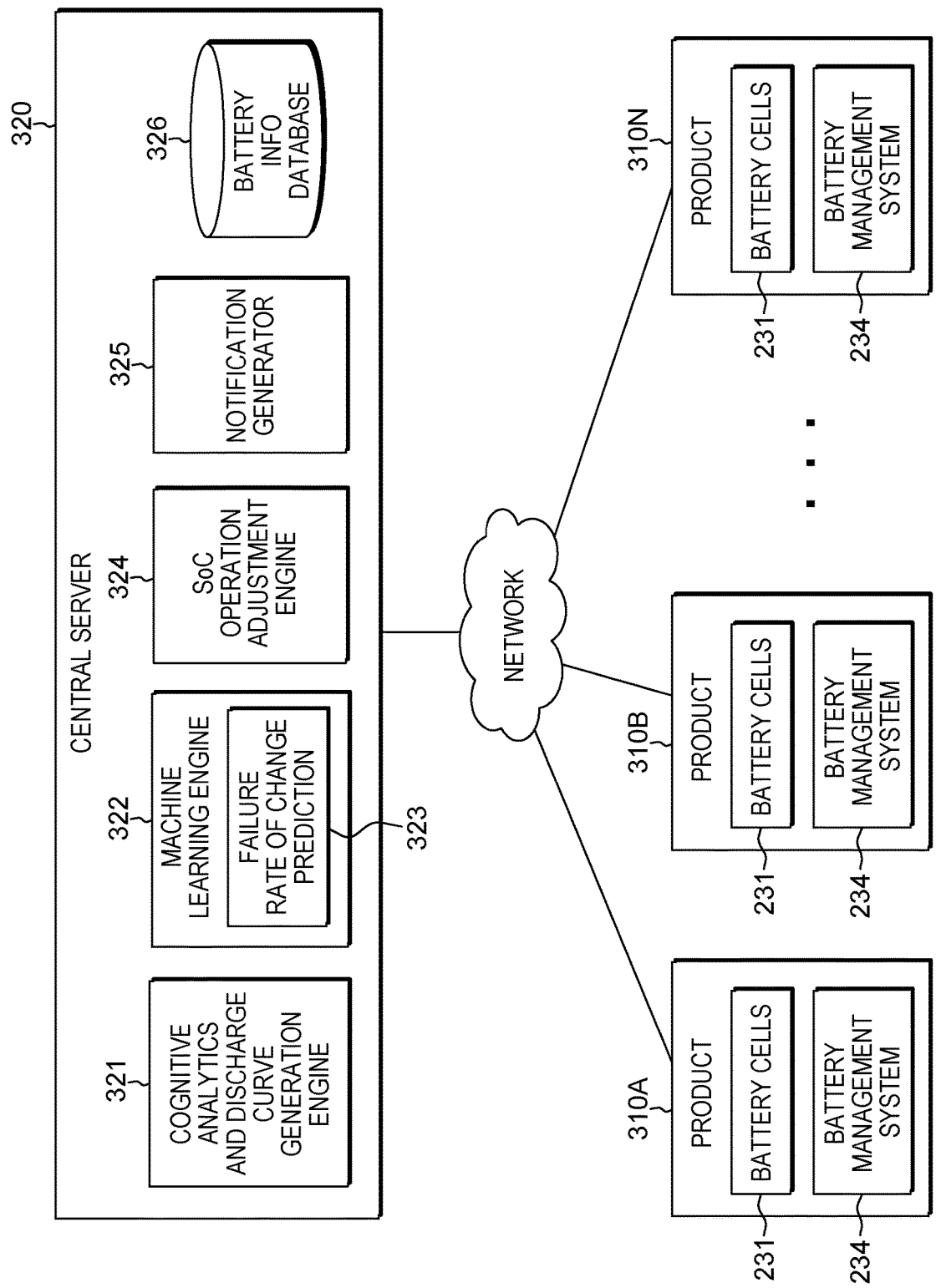
FIG. 3B is a further depiction of one embodiment of a predictive battery cell management system, in accordance with one or more aspects of the present invention.

FIG. 3B depicts a more detailed embodiment of the environment 300 of FIG. 3A, wherein a central cognitive server 320 is in communication with multiple products 310A, 310B . . . 310N across a network 301. Network 301 can be, for example, a telecommunications network, a local area network (LAN), a wide area network (WAN), such as the Internet, or a combination thereof, and can include wired, wireless, fiber optic connections, etc. Network 301 can include one or more wired and/or wireless networks that are capable of receiving and transmitting data, and control signals, as described herein. As noted, each product 310A, 310B . . . 310N includes one or more rechargeable battery cells 231 and, in one or more embodiments, a battery management system 234. As noted, the products are operational products in use at or for the end user(s).

By way of example, in one or more embodiments, central cognitive server 320 can implement a variety of engines, and can be, or can utilize, for instance, a cloud-based system. One cognitive system is the Watson™ system available from International Business Machines Corporation of Armonk, N.Y., USA. The Watson™ system is an application of advanced natural language processing, information retrieval, knowledge representation and reasoning, and machine-learning technologies in the field of domain question answering. The Watson™ system is built on International Business Machines Corporation's DeepQA™ technology used for hypothesis generation, massive evidence gathering, analysis, and scoring.

In the embodiment depicted, central cognitive server 320 includes, by way of example, a cognitive analytics and discharge curve generation engine 321, which aggregates data from products 310A-310N and generates an average discharge curve dependent, for instance, on the age and/or usage of the battery cells (e.g., number of charge cycles) of the same type, as well as specifies, for instance, the discharge curve limits, or threshold deviation curves. A machine learning engine 322 can be included to learn and establish baseline behavioral profiles for battery cells, and be used to find meaningful anomalies, which can be used as a basis for performing one or more battery-related actions.

The machine learning engine 322 can include a failure rate of change prediction facility, or engine, that compares a battery cell's data to one or more generated discharge curves obtained from statistical data on battery cell performance of a plurality of battery cells of similar type to the battery cell, and in corresponding condition(s). For instance, the statistical data can be accumulated at different points in the life cycle of the battery cells to determine if a particular battery cell is trending towards a specified limit (or threshold deviation) as the cell ages. A state of charge adjustment engine 324 is provided to increase or decrease a battery cell's maximum charge level (or full charge level) during a charge cycle to extend battery life and maintain the charge level of the battery cell at a safe level. For instance, rechargeable batteries that are charged to levels below 100% have less chance of experiencing a failure event, such as thermal runaway and/or an ignition event. A notification generator or facility 325 is also included to, for instance, provide an alert or notification to a user, operator, technician, etc., to replace a battery cell or battery pack that is trending towards a discharge curve limit (or threshold deviation curve) prior to the cell or battery falling outside of the specified limit(s). Central cognitive server 320 can also include a database 326 to hold, for instance, received data from the products for generating discharge curves, as described herein.

Figure 4A:
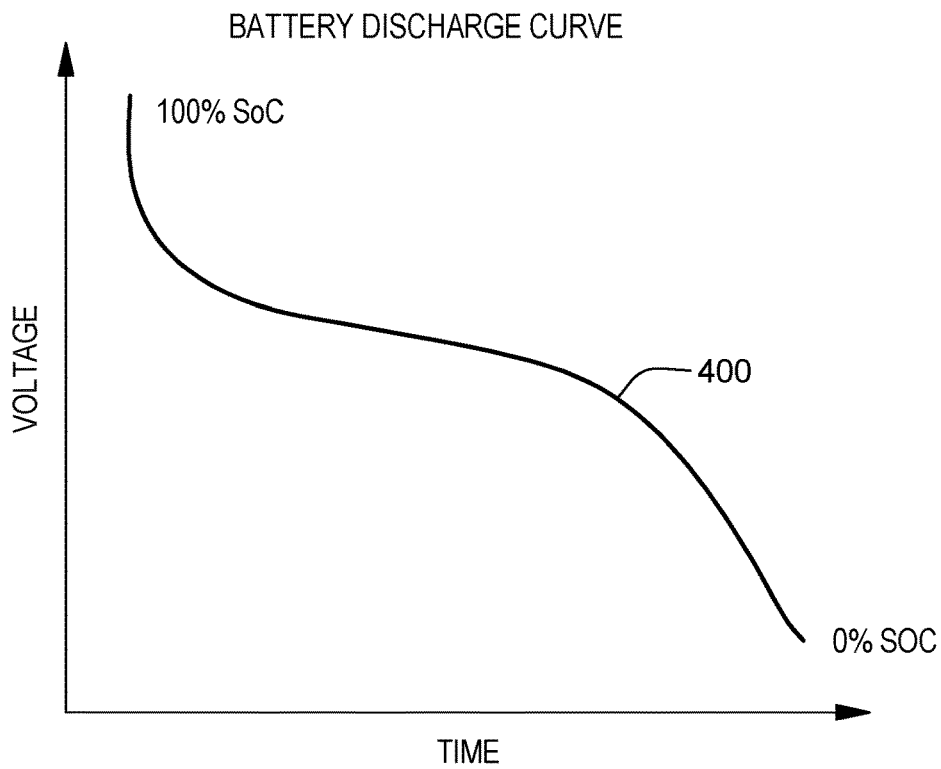
FIG. 4A graphically depicts one embodiment of a battery cell voltage discharge curve, which can be monitored by a predictive battery cell management system, in accordance with one or more aspects of the present invention.

FIG. 4A depicts one embodiment of a battery discharge curve 400 from a 100% state of charge level to a 0% state of charge level, over time. As explained herein, the predictive rechargeable battery management system monitors performance of battery cells used in a product, or in multiple products, of the same type, and aggregates the results of the cell performance data for that product on the central cognitive server. Using the aggregated data, a statistical model is created for an average expected discharge curve based on, for instance, the data from battery cells of similar type, and in corresponding condition(s), such as corresponding age and use (charge cycles) as the battery cell being evaluated.

Figure 4B:
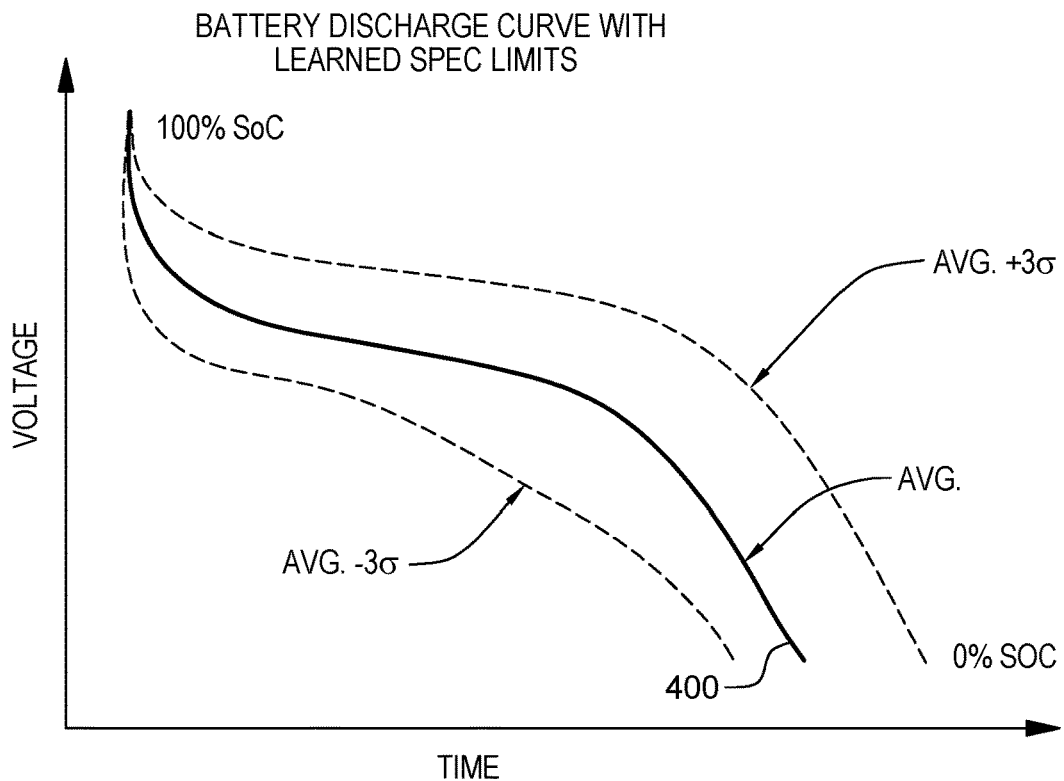
FIG. 4B is a graphical representation of an average battery cell discharge curve, as well as upper and lower threshold deviation curves which can be ascertained by a predictive battery cell management system, in accordance with one or more aspects of the present invention.

As shown in FIG. 4B, upper and lower battery cell discharge limits can be defined to assist the predictive rechargeable battery management system in identifying whether a particular battery cell is out-of-specification, or (for instance) to predict when a downward-trending battery cell will go out-of-specification, and to generate based thereon a notification to replace the defective cell with sufficient time for the cell to be replaced prior to the specified limit being reached. In the example of FIG. 4B, the upper and lower discharge limits are defined, by way of example, as $+/-3\sigma$ from the battery discharge curve 400, where the battery discharge curve is, in one example, an average battery discharge curve. Additionally, or alternatively, if battery cells are maintained at a state of charge (SoC) that is less than 100%, for instance, to minimize potential for thermal runaway, then the state of charge for a charge cycle can be automatically adjusted by the predictive rechargeable battery management system to extend the lifetime of the battery cell and/or prevent the need for battery replacement, as explained herein.

Figure 5:
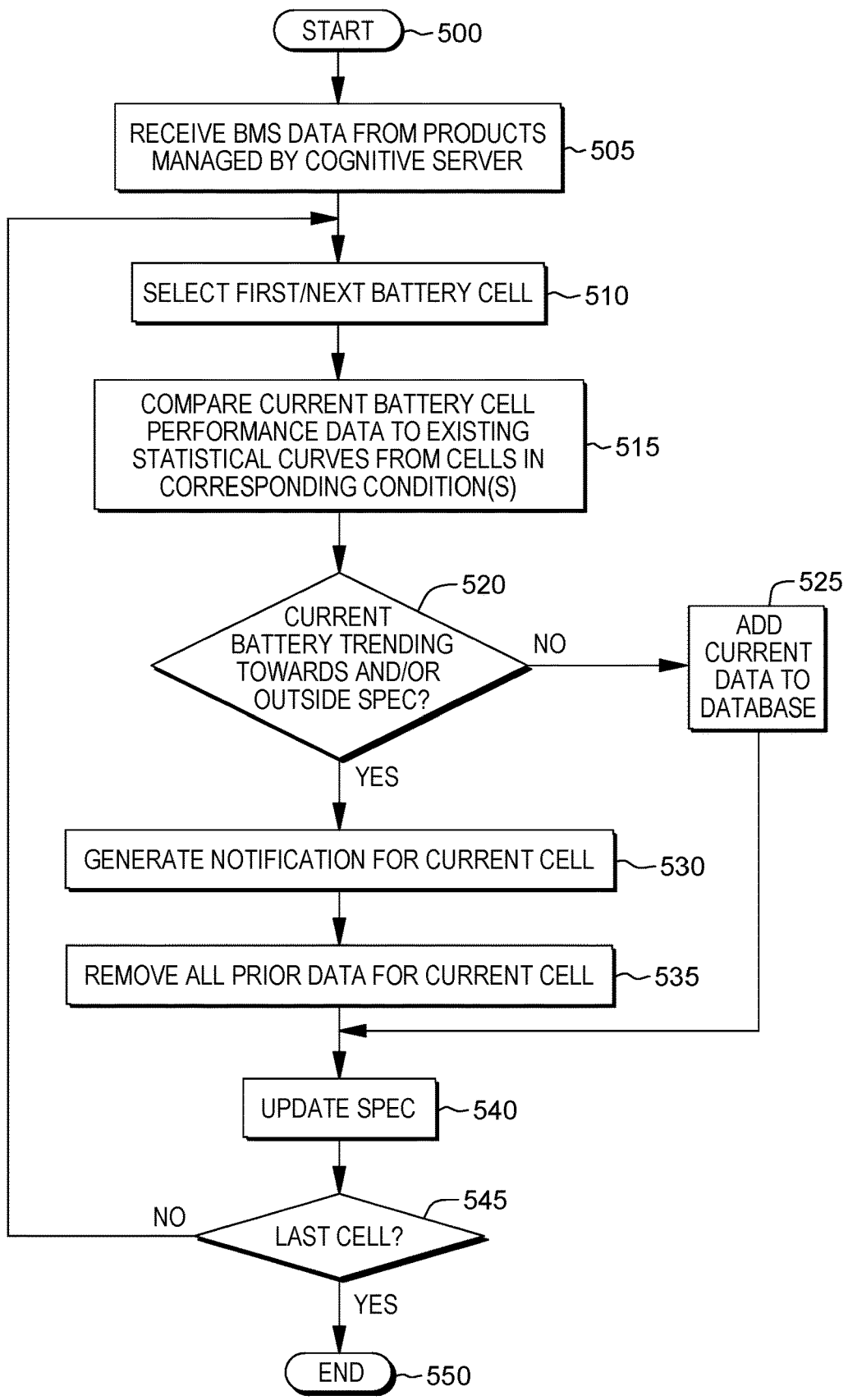
FIG. 5 depicts one embodiment of logic for predictive battery cell management, in accordance with one or more aspects of the present invention.

FIG. 5 depicts one embodiment of predictive battery cell management logic, in accordance with one or more aspects of the present invention. The method begins 500 with, for instance, the cognitive server receiving cell performance data from the battery management systems of one or more products being monitored 505. In one or more implementations, the products can periodically send data, for instance, hourly, daily, weekly, monthly, etc. Alternatively, the cognitive server can query the products for the battery performance data such that the received data can be spread out, that is, so that data from all the products does not arrive at the same time. The management logic of FIG. 5 includes iteratively analyzing the performance data of each individual battery cell in each product, with the first or next battery cell performance data 510 being selected. The current battery cell performance data is compared to the existing statistical data, such as the existing statistical curve(s), for the same type of battery cell in similar or corresponding condition(s) 515. The similar conditions can refer to a variety of conditions, such as similar temperature and humidity environments, similar battery cell age, similar number of charge cycles, etc. As noted, the process described is a cognitive approach, which can incorporate new battery data into the battery specification if the battery is deemed within specification. A first group of battery cells analyzed, for instance, for a new type of battery or new product, may not have prior history to refer to, so curves for a similar battery or similar product could be referenced until sufficient data is collected for the new battery cell type or new product type, as well as the manufacturer's specification for the battery.

Processing determines whether the performance data for the current battery cell is trending towards and/or is already outside of specification 520. If "no", then the performance data of the current battery cell is added to the database of performance data used to generate the statistical curves 525.

Figure 6A:
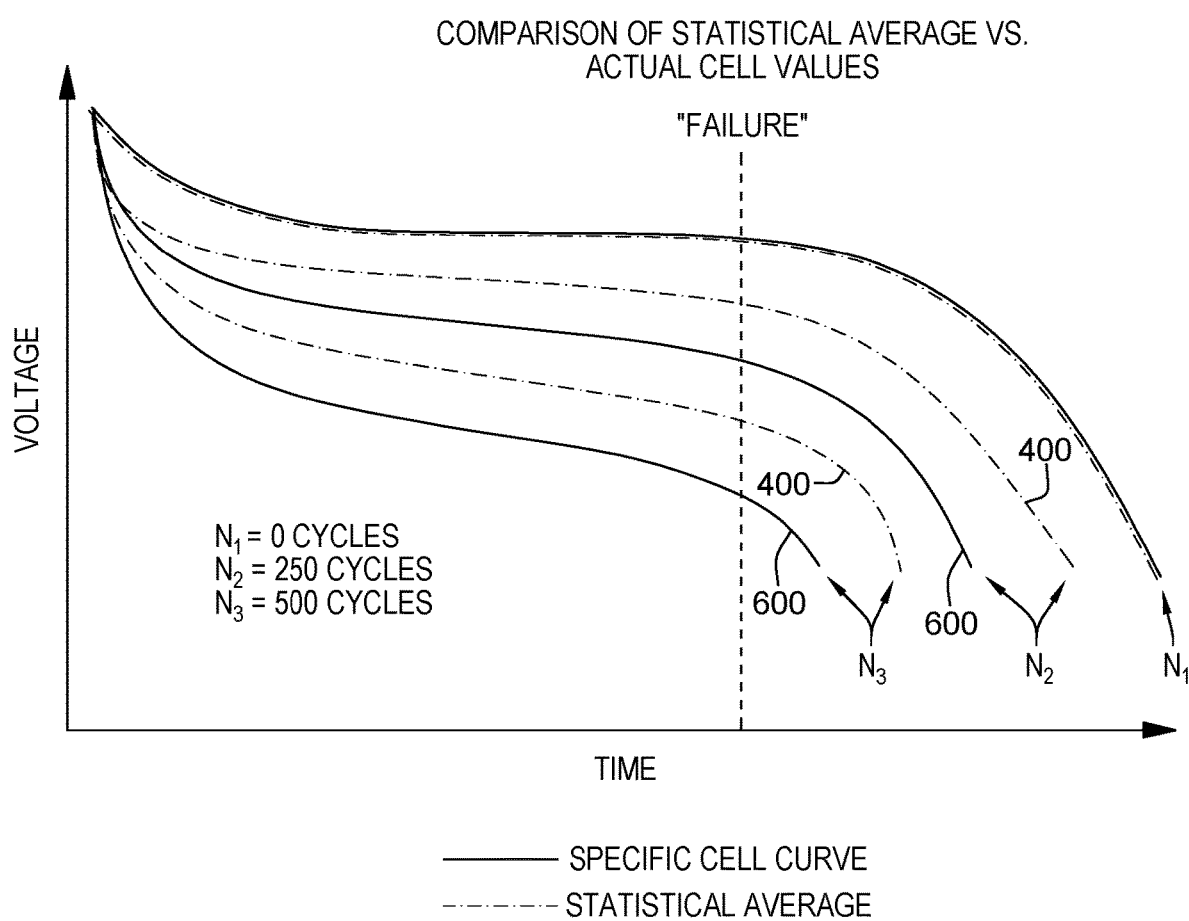
FIG. 6A graphically depicts a comparison of a statistical average battery discharge curve versus and an actual battery discharge curve at different numbers of charge cycles, in accordance with one or more aspects of the present invention.

FIG. 6A depicts a graphical example of performance data for a battery cell that is trending towards, or is already outside, the cognitively generated specified limits for that battery's current condition(s). In FIG. 6A, an average discharge cycle 400 is shown, generated from a plurality of battery cells of similar type and in corresponding condition(s) as the battery cell being evaluated. The actual battery cell's performance data 600 is also shown for three different charge cycles, that is, at zero cycles, 250 cycles, and 500 cycles, by way of example. To determine a trend pattern, the cognitive server can also access prior data for the current battery cell stored in the battery information database, such as data from past days, weeks, months, etc. For battery cells, failure can be defined as the cell's total capacity falling below some percentage of the cell's original capacity. For instance, a lithium-ion cell that has an initial holdup time of 150 seconds and a 20% capacity loss failure definition, might be considered "failed" when available holdup time drops below 120 seconds.

Based on the current battery trending towards and/or already being out-of-specification, a notification can be generated for the current battery cell 530, or more generally, a battery-related action can be performed. In the case where a notification is generated, if the battery cell is not yet outside out-of-specification, but is trending in that direction, the notification can include an expected remaining lifetime based, for instance, on the speed at which the battery is trending downward in quality. Depending on the product, the notification could go to the end user to notify the user to, for instance, replace the battery cell, or battery pack containing the cell, or replace an entire integrated battery feature of the product containing the cell, which can depend on the results and the product. Given the advance notification, such an action could be performed when other system maintenance might be required, that is, if the battery cell is not yet out-of-specification, or does not pose an immediate impact to the customer. Prior data for the failing cell can be removed from the database of cells 535 so as not to be included when the statistical curves are updated, as well as the specification limits 540. In this way, only performance data from battery cells that do not fail or trend towards failure faster than other cells are included in the statistical data used to generate the average discharge curve of the plurality of battery cells. For instance, the current battery cell may have been within specification for the first two months of use, and performance data of that cell may have been included in the statistical data for the first two months of use for the given product and the battery's environmental conditions. In the third month, the management system recognizes that the battery cell is now trending downward faster than expected, and after a notification is generated, the system can proceed with not including that battery cell's third month performance data in the statistical data from which the average battery discharge curve is generated, and also go back within the database to remove that battery's performance data for the first two months. The method can then recalculate the change in the discharge curve(s) and update the discharge curve limits for all previous data that could have been tainted by the current battery cell that is now trending towards failure. Processing determines whether this is the last battery cell to be evaluated, and if "no", then repeats the process 545. Otherwise, processing ends at step 550.

Figure 6B:
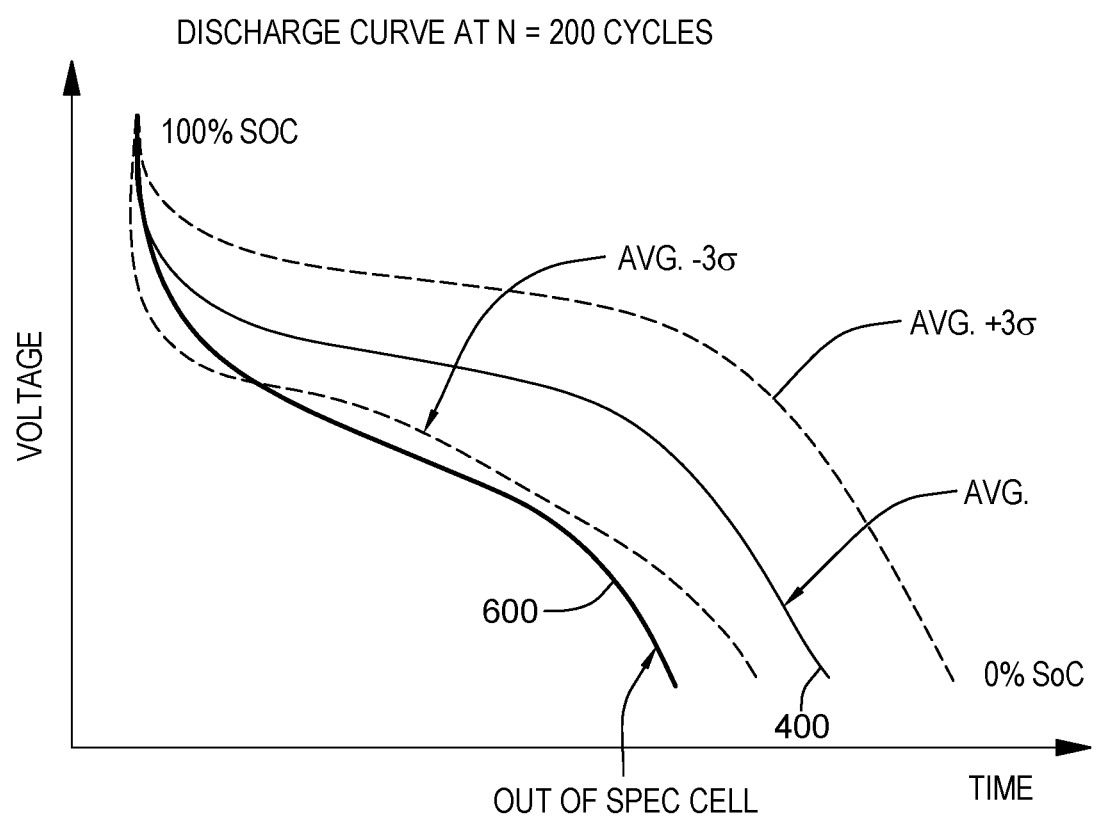
FIG. 6B is a graphical representation of one embodiment of an actual battery cell discharge curve at 200 charge cycles, shown as an out-of-specification cell to be identified by a predictive battery cell management system, in accordance with one or more aspects of the present invention.

In FIG. 6B, the management logic compares a discharge curve for the battery cell's $200^{th}$ charge cycle to the statistical data in the cognitive database for cells of the same type and in the same condition, for instance, the same average temperature profile, same number of cycles (generated from a plurality of cells in the field), etc. The predictive rechargeable battery management system identifies that the current battery cell discharge curve is falling out-of-specification or has fallen out-of-specification, which in the example of FIG. 6B, is +/−3σ range (by way of example only). Once identified, the management system can indicate that there is likely something wrong with the battery cell, and notify the end user that the battery pack should be serviced and/or replaced to correct the issue.

Figure 7:
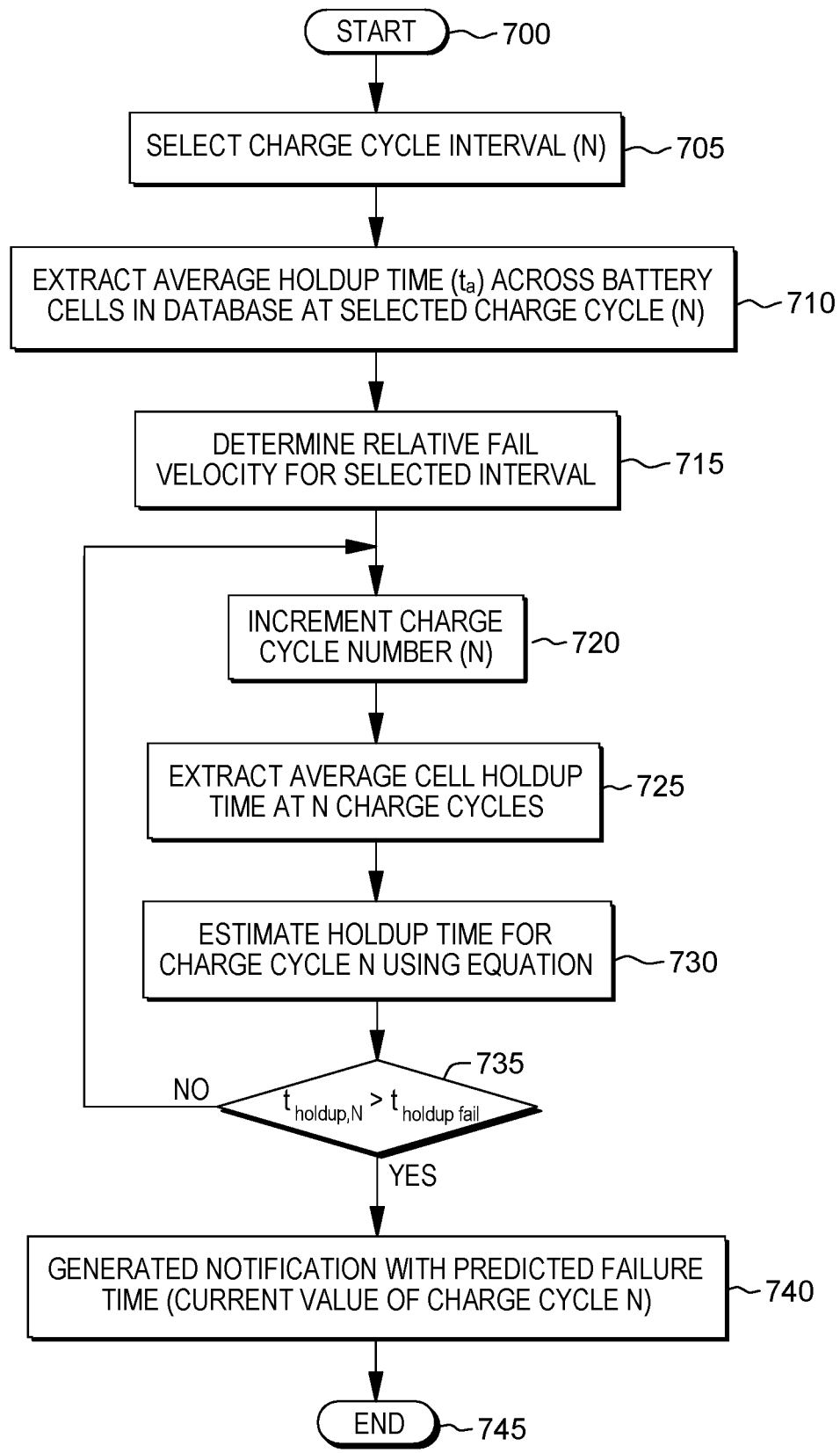
FIG. 7 depicts one embodiment of battery cell management logic for predicting failure of a battery, in accordance with one or more aspects of the present invention.

FIG. 7 depicts one embodiment of central cognitive server management logic for predicting failure of a battery cell, in accordance with one or more aspects of the present invention. Predicting when a particular battery cell is trending towards failure is advantageous information that can be included, for instance, in a generated notification to an end user, or even employed by the system in automatically adjusting, for instance, a state of charge of a battery cell to extend life of the cell.

As shown, the method begins 700 with selecting a charge cycle interval (N) 705. The number N of charge cycles refers to the number of charge-discharge cycles completed by a battery cell and that is obtained from, for instance, the battery management system for a particular product. By way of specific example, N might be 250 cycles. The average holdup time ($t_a$) is extracted across the battery cells of the same time from the database of battery cell information at the selected charge cycle N 710. A relative fail velocity is determined 715 for the selected interval as follows:

$$v_{rel\,fail} = \frac{\Delta t_{holdup}}{N}$$

where:
$v_{rel\,fail}$=relative fail velocity;
$\Delta t_{holdup}$=difference between average battery cell holdup time and current battery cell holdup time; and
N=charge cycle number.

An interim process then begins by incrementing the charge cycle number (N) 720 to determine a predicted failure time using the determined relative fail velocity for the current battery cell. This process begins by, for instance, incrementing the charge cycle count (N) by 1. The average cell holdup time is extracted at the current value of N from the database of performance data for the plurality of battery cells 725. The holdup time can be estimated for the current cycle N using 730:

$$t_{holdup,N} = t_{holdup,N-1} - (t_{a,N} - t_{a,N-1}) - V_{rel\,fail}$$

where:

$t_{holdup,N}$=current battery cell holdup time for charge cycle N;

$t_{holdup,N-1}$=current battery cell holdup time for charge cycle N-1;

$t_{a,N}$=average battery cell holdup time for charge cycle N; and $t_{a,N-1}$ average battery cell holdup time for charge cycle N-1.

The determined holdup time for the current cycle N is then compared to a failure holdup time, that is, the minimum level for holdup time that the end user of the product is willing to accept or support 735. If the determined holdup time is greater than the failure holdup time, then the process loops back to increment N, and repeat. If the determined holdup time is less than the failure holdup time, then the method generates a notification with a predicted failure time, which is the current value of N 740. This completes the prediction process embodiment depicted 745. Note that the above process assumes a linear relative fail velocity. The process, or more particularly, the holdup equation above, can be modified if the cognitive engine recognizes a pattern that follows a different curve (e.g., polynomial).

Figure 8A:
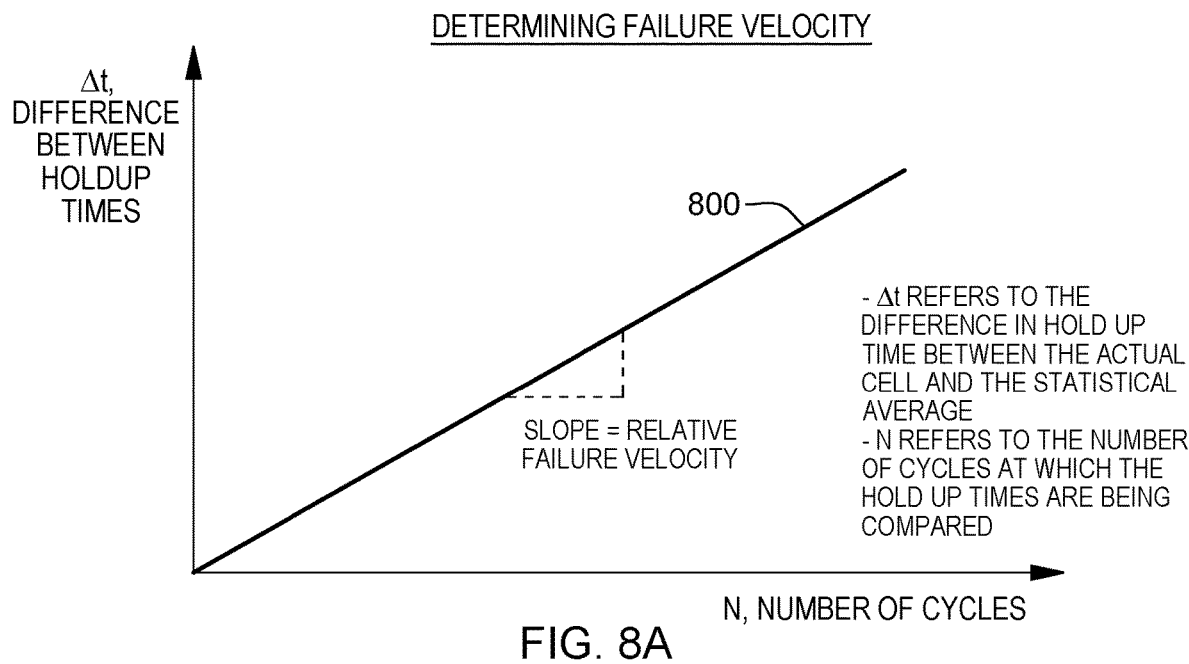
FIG. 8A graphically depicts a difference in hold-up time of an actual battery cell and a statistical average cell compared at different numbers of charge cycles, and with a relative failure velocity plotted, in accordance with one or more aspects of the present invention.

FIG. 8A depicts one embodiment of determining failure velocity, where the slope of the Δt difference between holdup times and a number of cycles is the relative failure velocity 800. If the slope is positive, then the cell is weaker than the statistical average, and the "relative failure velocity" can be used to determine how much faster the cell will fail as compared to the average cell. If the slope is negative, then the cell is stronger than the statistical average, and the "relative failure velocity" (slope) can be used to determine how much longer the cell will last as compared to the average cell.

Figure 8B:
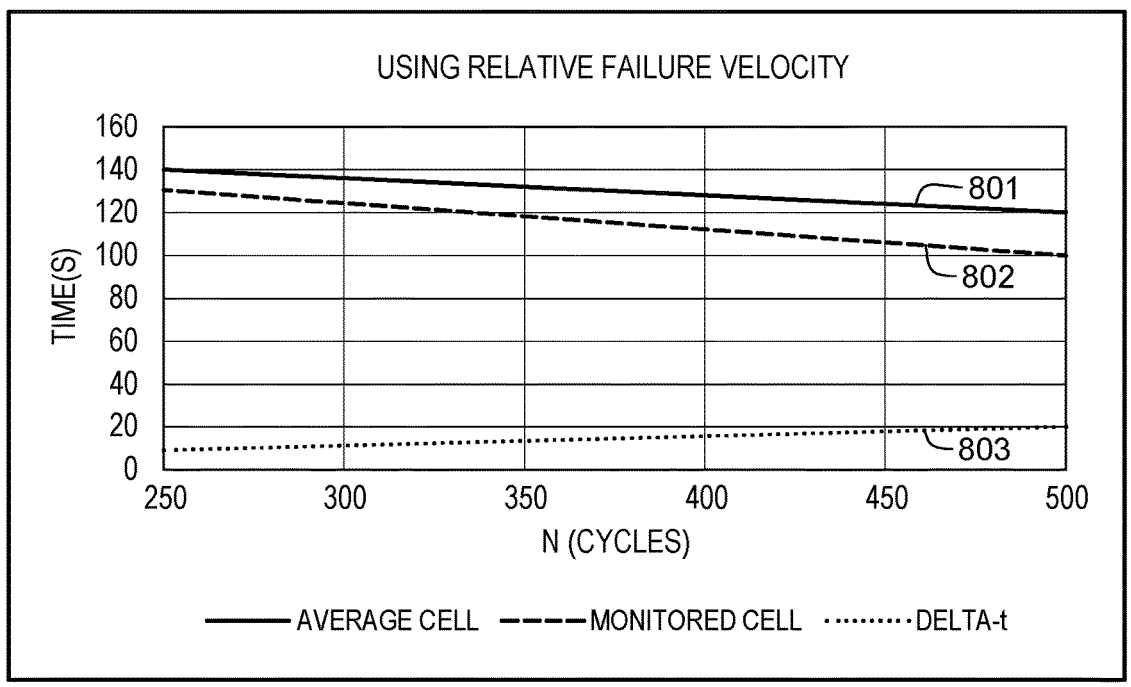
FIG. 8B graphically illustrates relative failure velocity for a battery cell, assuming linear failure rates, and comparing monitored cell failure velocity with an average cell failure velocity, in accordance with one or more aspects of the present invention.

FIG. 8B depicts a plot of the average cell versus the monitored cell, as well as the Δt. The plot presents a cell that is weaker than the average cell, and therefore, has a positive slope, which means that it will fail faster than the average cell. For a slope close to zero, the cell is close to the average cell.

Figure 9:
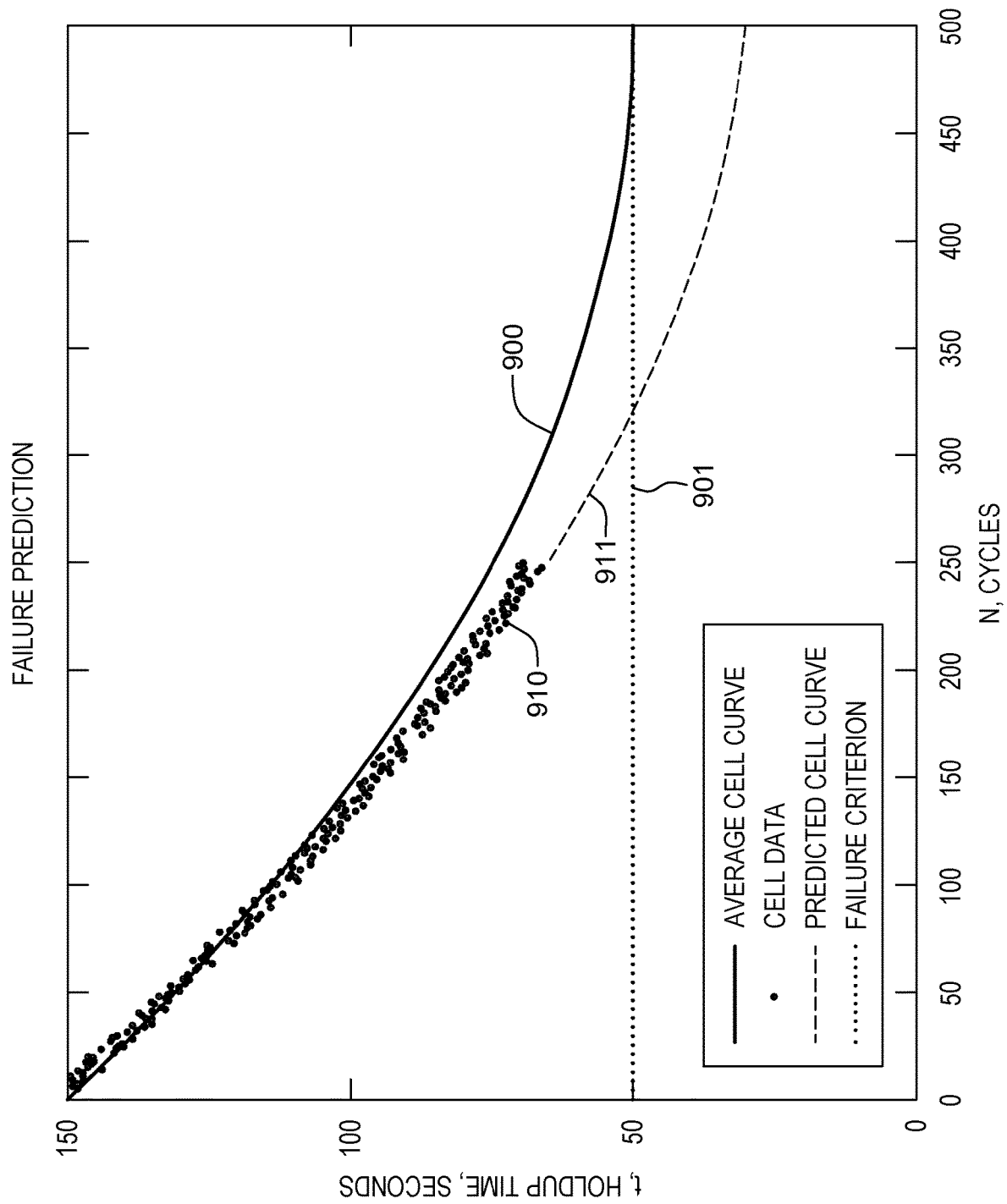
FIG. 9 graphically depicts a battery cell failure prediction, where cell data is plotted against an average cell failure curve, and a defined failure criterion, and illustrates hold-up time of the actual battery cell versus number of charge cycles, as determined by a predictive battery cell management system, in accordance with one or more aspects of the present invention.

FIG. 9 depicts a failure prediction example, where an average cell curve 900 is plotted, along with cell data 910, for a particular battery cell, and the predicted cell curve 911 in comparison to a defined failure criterion 901 for the particular product. In this example, holdup time t in seconds is plotted against charge cycles N. As can be seen, the predicted cell curve 911 is trending away from the average cell curve 900, and is predicted to reach the failure criterion at a sooner number of charge cycles than the average cell curve. Based on this information, an appropriate battery-related action can be performed, as described herein. This battery-related action can include, for instance, an automatic state of charge adjustment.

Figure 10:
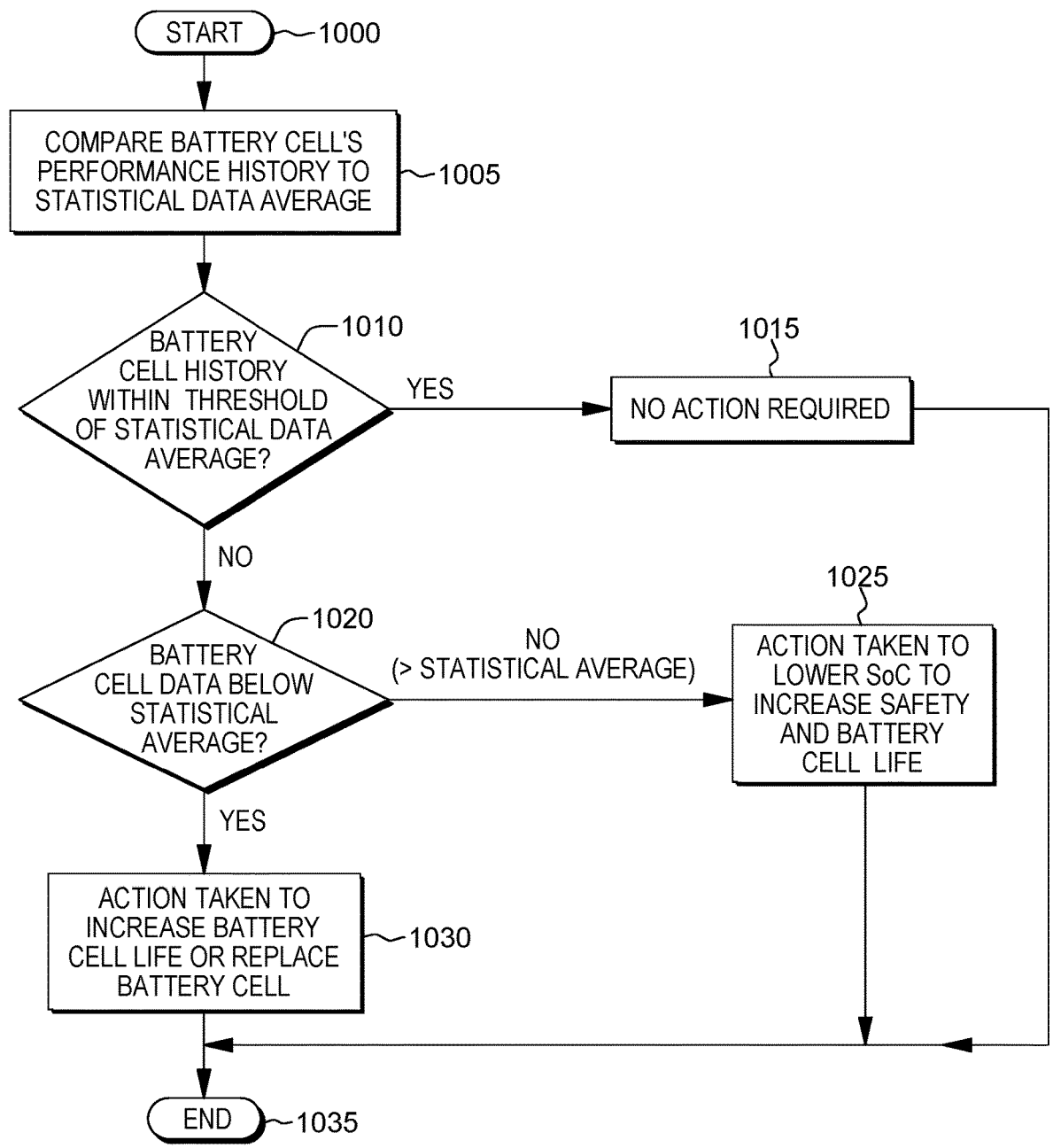
FIG. 10 depicts one embodiment of logic for adjusting a battery cell's state of charge level for charge cycle, in accordance with one or more aspects of the present invention.

FIG. 10 depicts one embodiment of a state of charge adjustment process, in accordance with one or more aspects of the present invention. As noted, rather than sending out a notification immediately upon detection of a battery cell being out-of-specification, or trending out-of-specification, another approach is to adjust the battery cell's state of charge for applications where the battery cell typically operates at less than 100% state of charge. As noted, an example of this would be lithium-ion battery cells that might be operated at 80% state of charge (SoC) at all times, in order to minimize the risk of thermal runaway and/or potential battery ignition.

The method begins 1000 with comparing a battery cell's performance data history to the statistical data average 1005. In particular, processing determines whether the battery cell's data history is within the threshold of the statistical data average 1010. For instance, processing can determine whether the battery cell's data history is within 1 standard deviation, 2 standard deviations, etc., of the statistical data average. If "yes", then no action is required 1015, and the process ends 1035. If the battery cell data is not within a threshold of the statistical data average, then the method can determine if the battery cell's discharge curve is above or below the statistical average 1020.

If the battery cell's discharge curve is below the statistical average curve by more than a threshold deviation, then the method will take action to increase the lifetime of the battery cell, or battery pack 1025. The action could be to increase the maximum state of charge of the battery cell. For instance, if the state of charge of the battery cell had been 50%, the action could be to increase the state of charge to 60%. Increasing the battery cell's state of charge will raise the discharge curve to a level that is within the threshold of the statistical average. Further, increasing the battery cell's state of charge does shorten the lifetime of the battery cell, but this is a cell that is recognized to be failing already, so the act of increasing the state of charge could make it last longer in the product than it would otherwise last if no action is taken. Note that the level of increase in the battery cell's state of charge can be dependent on how far below the threshold the battery cell's discharge curve is, and can be based on previously learned data from other battery cells that have had their state of charge increased in the product. The process can be continuously repeated over time until the battery cell's state of charge has reached a maximum desired level (e.g., 100%, and cannot increase any more, at which point the cell will have to be replaced). For instance, a battery cell's SoC might be increased from an initial charged state of 50% to 60% after two months, increased again to 70% after another three months when the discharge curve again falls out of the threshold, increased again to 80% after another few months, and so on, up to 100%.

If the battery cell's discharge curve is above the statistical average by more than the threshold, then the process can take action to decrease the state of charge of the battery cell or battery pack 1030. For instance, if the state of charge of the battery cell had been 50%, then the action could be to decrease the state of charge to 45%. Decreasing the battery cell's state of charge will lower the discharge curve to a level that is within the threshold of the statistical average. The action of decreasing the battery cell's state of charge will not only extend the lifetime of the battery cell, but also provide additional protection against ignition since less charge is stored in the cell. The level of the decrease in the battery cell's state of charge can be dependent on how far above the threshold the battery cell's discharge curve is, and based on previously learned data from other battery cells that have had their state of charge decreased in the product. This process can be continuously repeated over time until the battery cell's state of charge has reached a minimum desired level (e.g., 20%), that is, a level at which an end user may not want to have the state of charge decreased any further, at which point the cell will have to be replaced. For instance, if a battery's cell is decreased from its initial state of charge of 50% to 45% after two months, it may be decreased again to 40% after another three months when the discharge curve again falls out of the threshold, and decreased again to 35% after another few months, and so on, down to 20%, again by way of example only. Once the action has been taken to adjust the state of charge, the process is complete 1035.

One example of a computer system that includes processors that may be used by one or more aspects of the present invention is described with reference to FIG. 11. In this example, the computer system is part of a computing environment including additional components that may or may not be used by aspects of the present invention.

Figure 11:
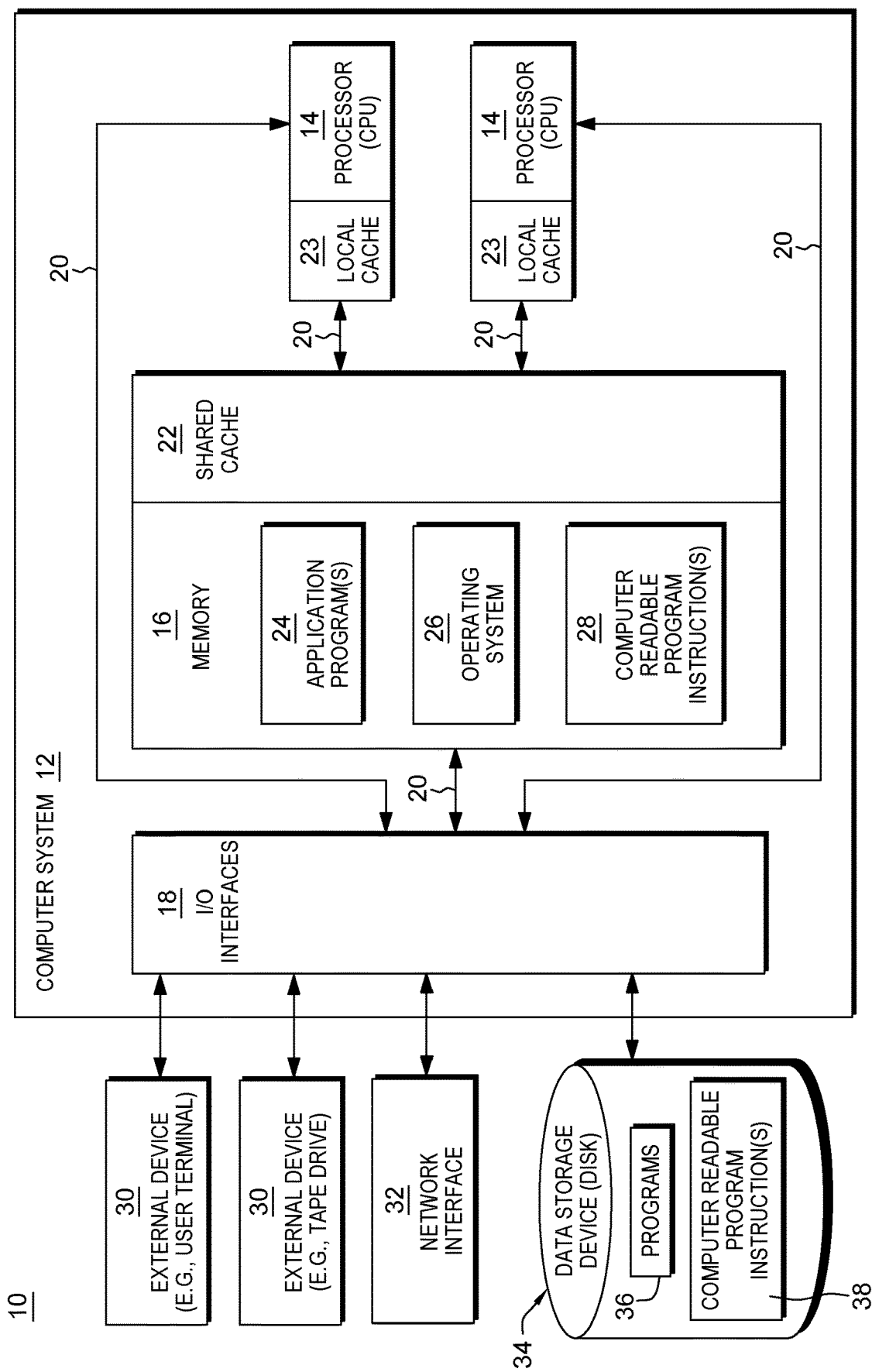
FIG. 11 depicts one embodiment of a computing system which can implement or facilitate implementing one or more aspects of predictive battery cell management, in accordance with one or more aspects of the present invention.

As shown in FIG. 11, a computing environment 10 includes, for instance, a computer system 12 shown, e.g., in the form of a general-purpose computing device. Computer system 12 may include, but is not limited to, one or more processors or processing units 14 (e.g., central processing units (CPUs)), a memory 16 (a.k.a., system memory, main memory, main storage, central storage or storage, as examples), and one or more input/output (I/O) interfaces 18, coupled to one another via one or more buses and/or other connections 20.

Bus 20 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 16 may include, for instance, a cache 22, such as a shared cache, which may be coupled to local caches 23 of processors 14. Further, memory 16 may include one or more programs or applications 24, an operating system 26, and one or more computer readable program instructions 28. Computer readable program instructions 28 may be configured to carry out functions of embodiments of aspects of the invention.

Computer system 12 may also communicate via, e.g., I/O interfaces 18 with one or more external devices 30, one or more network interfaces 32, and/or one or more data storage devices 34. Example external devices include a user terminal, a tape drive, a pointing device, a display, etc. Network interface 32 enables computer system 12 to communicate with one or more networks, such as a local area network (LAN), a general wide area network (WAN), and/or a public network (e.g., the Internet), providing communication with other computing devices or systems.

Data storage device 34 may store one or more programs 36, one or more computer readable program instructions 38, and/or data, etc. The computer readable program instructions may be configured to carry out functions of embodiments of aspects of the invention.

Computer system 12 may include and/or be coupled to removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media. It should be understood that other hardware and/or software components could be used in conjunction with computer system 12. Examples, include, but are not limited to: microcode, device drivers, redundant processing units, external disk drive arrays, RAID systems, tape drives, and data archival storage systems, etc.

Computer system 12 may be operational with numerous other general purpose or special purpose computing system environments or configurations. Examples of well-known computing systems, environments, and/or configurations that may be suitable for use with computer system 12 include, but are not limited to, personal computer (PC) systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

In one example, a processor, such as processor 14, may execute one or more components to perform one or more aspects of the present invention. These components may be stored in memory, including main memory (e.g., memory 16) and/or one or more caches (e.g., shared cache 22, local cache 23) and/or external storage (e.g., device 34), and may be executed by one or more processors (e.g., processor 14).

One or more aspects may relate to cloud computing.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 12:
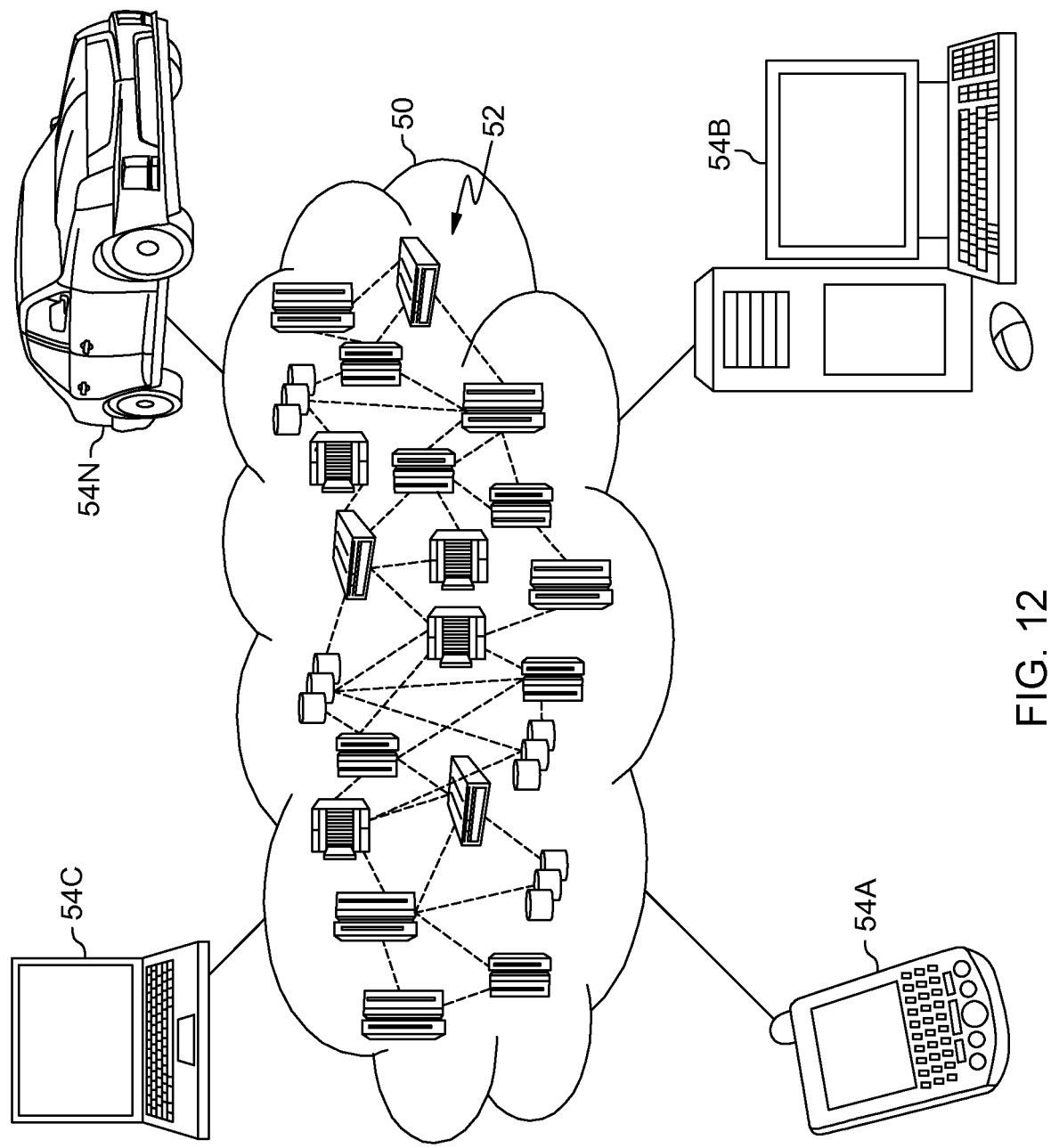
FIG. 12 depicts one embodiment of a cloud computing environment, which can implement, or be used in association with one or more aspects of the present invention.

Referring now to FIG. 12, illustrative cloud computing environment 50 is depicted. As shown, cloud computing environment 50 comprises one or more cloud computing nodes 52 with which local computing devices used by cloud consumers, such as, for example, personal digital assistant (PDA) or cellular telephone 54A, desktop computer 54B, laptop computer 54C, and/or automobile computer system 54N may communicate. Nodes 52 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 12 are intended to be illustrative only and that computing nodes 52 and cloud computing environment 50 can communicate with any type of computerized device over any type of network and/or network addressable connection (e.g., using a web browser).

Figure 13:
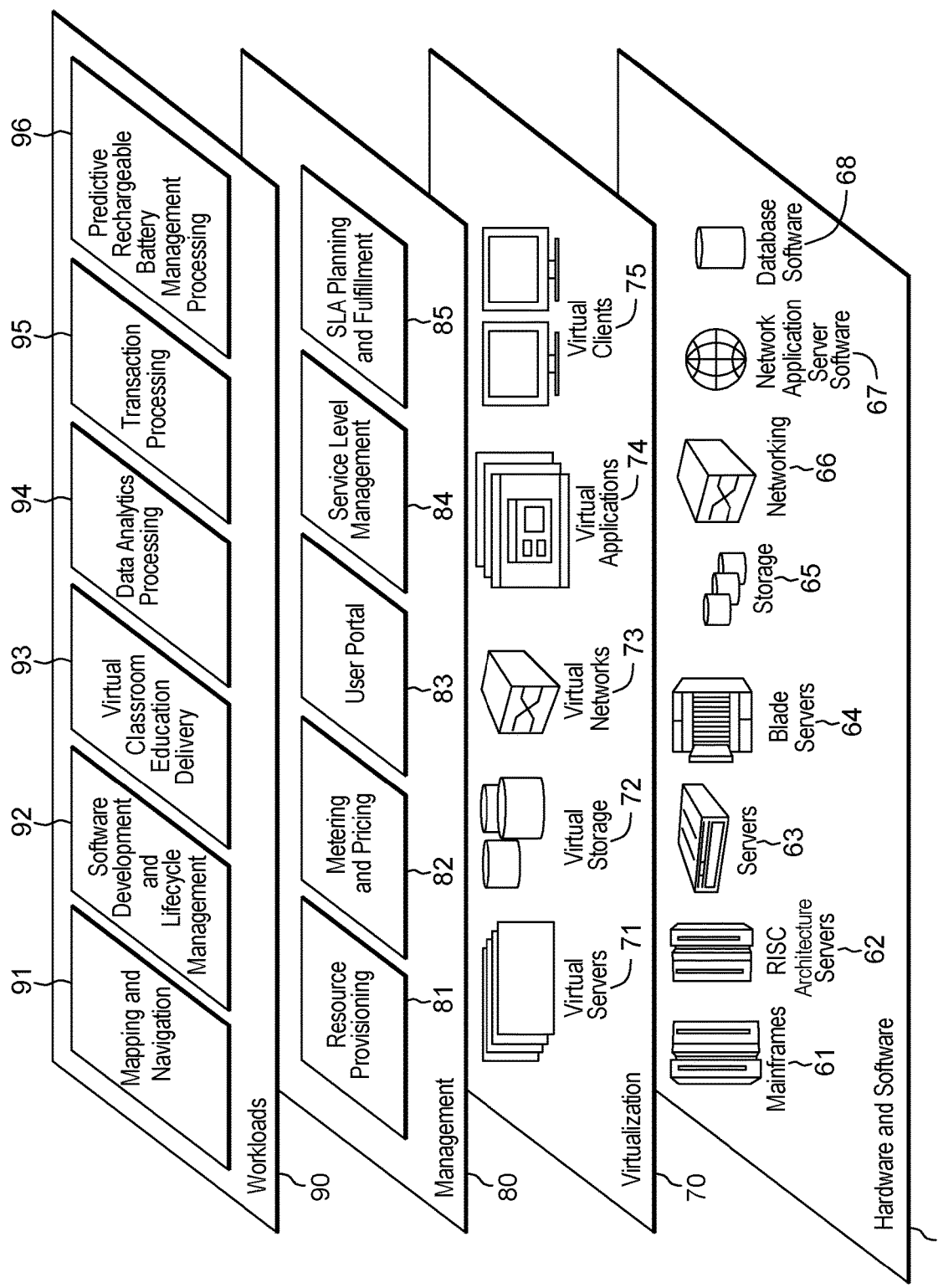
FIG. 13 depicts one example of abstraction model layers, which can facilitate or implement one or more aspects of predictive battery cell management processing, in accordance with one or more aspects of the present invention.

Referring now to FIG. 13, a set of functional abstraction layers provided by cloud computing environment 50 (FIG. 12) is shown. It should be understood in advance that the components, layers, and functions shown in FIG. 13 are intended to be illustrative only and embodiments of the invention are not limited thereto. As depicted, the following layers and corresponding functions are provided.

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; predictive rechargeable battery cell management processing 96.

Aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, other types of devices and/or tracking components may be used in one or more embodiments. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of managing rechargeable battery cells, the method comprising:
    obtaining performance data on a battery cell of multiple rechargeable battery cells within a product;
    comparing, by a processor, the performance data of the battery cell to statistical data on battery cell performance of a plurality of battery cells;
    determining, based on the comparison, that performance of the battery cell is trending away from the statistical data of battery cell performance of the plurality of battery cells; and
    performing a battery-related action based on the performance of the battery cell trending away from that of the plurality of battery cells.

2. The method of claim 1, wherein performing the battery-related action comprises providing a notification regarding the battery cell's performance.

3. The method of claim 1, wherein performing the battery-related action comprises adjusting a state of charge level used in a charge cycle of the battery cell to extend life of the battery cell, and thereby optimize life of the multiple rechargeable battery cells within the product.

4. The method of claim 1, further comprising obtaining performance data on the plurality of battery cells and generating an average discharge curve for the plurality of battery cells, the average discharge curve being representative of the statistical data, and the comparing comprises comparing the performance data of the battery cell to the average discharge curve for the plurality of battery cells.

5. The method of claim 4, wherein the determining comprises ascertaining that the performance of the battery cell is outside a threshold deviation from the average discharge curve generated for the plurality of battery cells.

6. The method of claim 1, further comprising, based on determining that performance of the battery cell is within the statistical data of battery cell performance of the plurality of battery cells, adding the performance data of the battery cell to a database of performance data of the plurality of battery cells for use as part of the statistical data.

7. The method of claim 1, further comprising automatically projecting a time to failure of the battery cell, and wherein performing the battery-related action includes referencing the projected failure time of the battery cell.

8. The method of claim 7, wherein projecting the failure time of the battery cell comprises, at least in part, determining a relative fail velocity for the battery cell at a selected number of charge cycles, the determining of the relative fail velocity being based on:

$$v_{relfail} = \frac{\Delta t_{holdup}}{N}$$

where:

$v_{rel\,fail}$=relative fail velocity;

$\Delta t_{holdup}$=difference between average battery cell holdup time and current battery cell holdup time; and N=charge cycle number.

9. The method of claim 8, wherein projecting the time to failure of the battery cell includes determining a current battery cell hold-up time for charge cycle N by:

$$t_{holdup,N}=t_{holdup,N-1}-(t_{a,N}-t_{a,N-1})-v_{rel\,fail}$$

where:

$t_{holdup,N}$=current battery cell holdup time for charge cycle N;

$t_{holdup,N-1}$=current battery cell holdup time for charge cycle N-1;

$t_{a,N}$=average battery cell holdup time for charge cycle N; and $t_{a,N-1}$=average battery cell holdup time for charge cycle N-1.

10. A system for managing rechargeable battery cells, the system comprising:

a memory; and a processor communicatively coupled to the memory, wherein the system performs a method comprising:

obtaining performance data on a battery cell of multiple rechargeable battery cells within a product;

comparing the performance data of the battery cell to statistical data on battery cell performance of a plurality of battery cells;

determining, based on the comparing, that performance of the battery cell is trending away from the statistical data of battery cell performance of the plurality of battery cells; and performing a battery-related action based on the performance of the battery cell trending away from that of the plurality of battery cells.

11. The system of claim 10, wherein performing the battery-related action comprises providing a notification regarding the battery cell's performance.

12. The system of claim 10, wherein performing the battery-related action comprises adjusting a state of charge level for a charge cycle of the battery cell to extend life of the battery cell.

13. The system of claim 10, further comprising obtaining performance data on the plurality of battery cells and generating an average discharge curve for the plurality of battery cells, the average discharge curve being representative of the statistical data, and the comparing comprises comparing the performance data of the battery cell to the average discharge curve for the plurality of battery cells.

14. The system of claim 13, wherein the determining comprises ascertaining that the performance of the battery cell is outside a threshold deviation from the average discharge curve generated for the plurality of battery cells.

15. The system of claim 10, further comprising automatically projecting a time to failure of the battery cell, and wherein performing the battery-related action includes referencing the projected failure time of the battery cell.

16. A computer program product for managing rechargeable battery cells, the computer program product comprising:

a computer-readable storage medium having program instructions embodied therewith, the program instructions being executable by a processor to cause the processor to:

obtain performance data on a battery cell of multiple rechargeable battery cells within a product;

compare the performance data of the battery cell to statistical data on battery cell performance of a plurality of battery cells;

determine, based on the compare, that performance of the battery cell is trending away from the statistical data of battery cell performance of the plurality of battery cells; and perform a battery-related action based on the performance of the battery cell trending away from that of the plurality of battery cells.

17. The computer program product of claim 16, further comprising obtaining performance data on the plurality of battery cells and generating an average discharge curve for the plurality of battery cells, the average discharge curve being representative of the statistical data, and the comparing comprises comparing the performance data of the battery cell to the average discharge curve for the plurality of battery cells.

18. The computer program product of claim 17, the determining comprises ascertaining that the performance of the battery cell is outside a threshold deviation from the average discharge curve generated for the plurality of battery cells.

* * * * *